(12) United States Patent
Lindsay

(10) Patent No.: US 7,704,823 B2
(45) Date of Patent: Apr. 27, 2010

(54) STRAINED SEMICONDUCTOR DEVICE AND METHOD OF MAKING SAME

(75) Inventor: Richard Lindsay, Fishkill, NY (US)

(73) Assignee: Infineon Technologies AG, Munich (DE)

( * ) Notice: Subject to any disclaimer, the term of this patent is extended or adjusted under 35 U.S.C. 154(b) by 487 days.

(21) Appl. No.: 11/521,802

(22) Filed: Sep. 15, 2006

(65) Prior Publication Data

US 2008/0057665 A1    Mar. 6, 2008

Related U.S. Application Data

(60) Provisional application No. 60/841,601, filed on Aug. 31, 2006.

(51) Int. Cl.
*H01L 21/8238* (2006.01)

(52) U.S. Cl. .................. 438/232; 438/197; 438/400; 257/E21.197

(58) Field of Classification Search ........... 438/197, 438/232, 400
See application file for complete search history.

(56) References Cited

U.S. PATENT DOCUMENTS

| 6,979,627 | B2 | 12/2005 | Yeap et al. |
|---|---|---|---|
| 7,002,209 | B2 | 2/2006 | Chen et al. |
| 7,012,028 | B2 | 3/2006 | Bu et al. |
| 7,256,081 | B2 | 8/2007 | Yang et al. |
| 7,342,284 | B2 | 3/2008 | Ting et al. |
| 7,384,833 | B2 | 6/2008 | Polishchuk et al. |
| 2002/0045325 | A1 | 4/2002 | Kuhn et al. |
| 2005/0051867 | A1 | 3/2005 | Lee et al. |
| 2005/0136583 | A1 | 6/2005 | Chen et al. |
| 2005/0199958 | A1* | 9/2005 | Chen et al. ............ 257/368 |
| 2006/0035425 | A1 | 2/2006 | Carter et al. |
| 2006/0040462 | A1 | 2/2006 | Wu et al. |
| 2007/0108529 | A1* | 5/2007 | Huang et al. .......... 257/368 |
| 2007/0138564 | A1 | 6/2007 | Lim et al. |
| 2007/0269970 | A1 | 11/2007 | Purtell et al. |

* cited by examiner

*Primary Examiner*—Alexander G Ghyka
(74) *Attorney, Agent, or Firm*—Slater & Matsil, L.L.P.

(57) ABSTRACT

To form a semiconductor device, an electrode layer is formed over a semiconductor body. The electrode layer includes an amorphous portion. A liner, e.g., a stress-inducing liner, is deposited over the electrode layer. The electrode layer is annealed to recrystallize the amorphous portion of the electrode layer. The liner can then be removed and an electronic component (e.g., a transistor) that includes a feature (e.g., a gate) formed from the electrode layer can be formed.

23 Claims, 3 Drawing Sheets

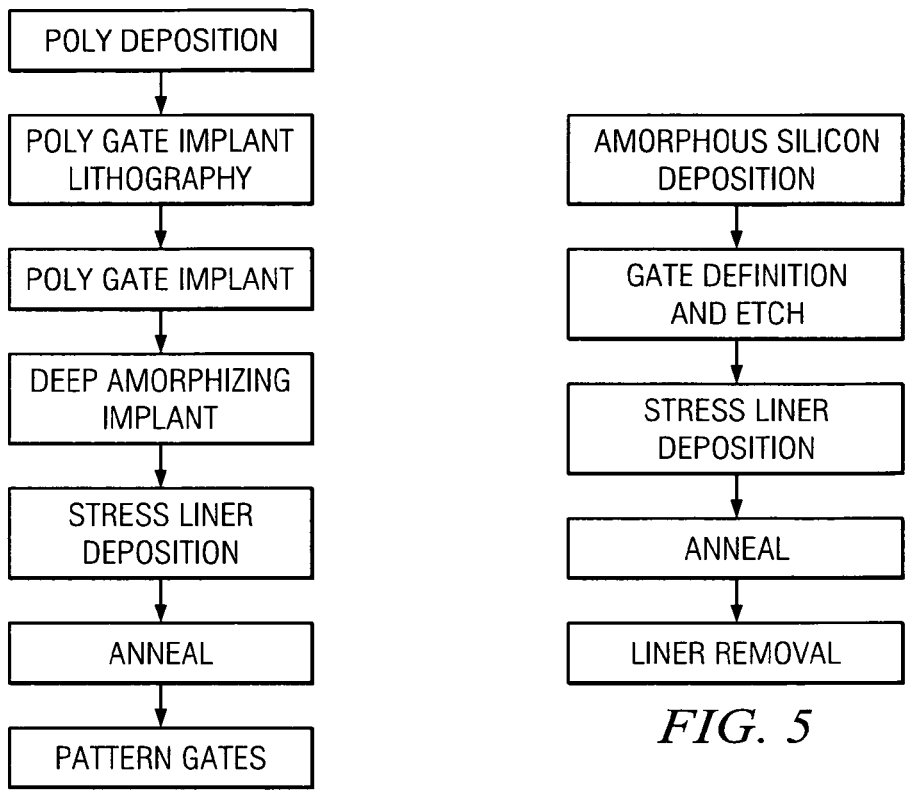
FIG. 3
FIG. 5
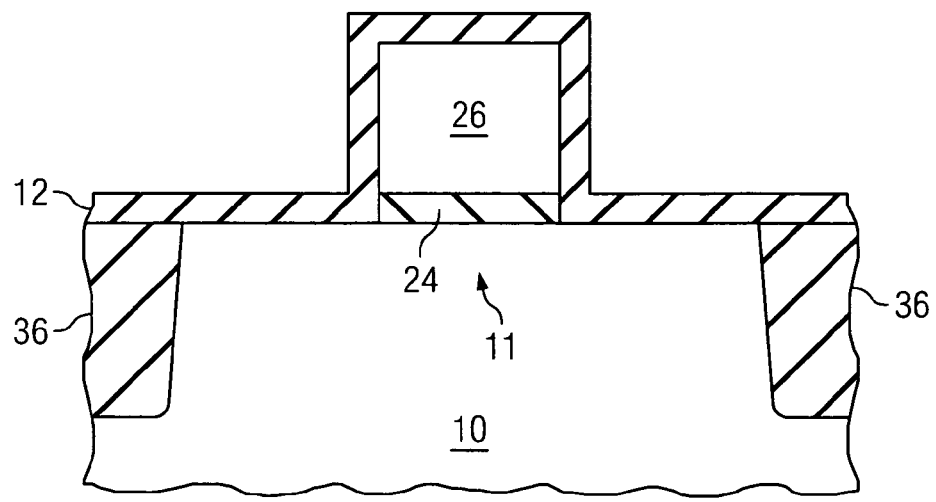
FIG. 4

STRAINED SEMICONDUCTOR DEVICE AND METHOD OF MAKING SAME

This application claims the benefit of U.S. Provisional Application No. 60/841,601, filed on Aug. 31, 2006, entitled "Strained Semiconductor Device and Method of Making Same", which application is hereby incorporated herein by reference.

CROSS-REFERENCE TO RELATED APPLICATIONS

This application relates to the following co-pending and commonly assigned patent applications: Ser. No. 11/521,804, filed Sep. 15, 2006; and Ser. No. 11/521,809, filed Sep. 15, 2006, which applications are hereby incorporated herein by reference.

TECHNICAL FIELD

This invention relates generally to semiconductor devices and methods, and more particularly to devices and methods for modulating stress in transistors in order to improve performance.

BACKGROUND

Semiconductor devices are used in a large number of electronic devices, such as computers, cell phones and others. One of the goals of the semiconductor industry is to continue shrinking the size and increasing the speed of individual devices. Smaller devices can operate at higher speeds since the physical distance between components is smaller. In addition, higher conductivity materials, such as copper, are replacing lower conductivity materials, such as aluminum. One other challenge is to increase the mobility of semiconductor carriers such as electrons and holes.

One technique to improve transistor performance is to strain (i.e., distort) the semiconductor crystal lattice near the charge-carrier channel region. Transistors built on strained silicon, for example, have greater charge-carrier mobility than those fabricated using conventional substrates. One technique to strain silicon is to provide a layer of germanium or silicon germanium. A thin layer of silicon may be grown over the germanium-containing layer. Since the germanium crystal lattice is larger than the silicon, the germanium-containing layer creates a lattice mismatch stress in adjacent layers. Strained channel transistors may then be formed in the strained silicon layer.

Another technique is to provide a stress layer over the transistor. Variants of stress layers can be used for mobility and performance boost of devices. For example, stress can be provided by a contact etch stop layer (CESL), single layers, dual layers, stress memory transfer layers, STI liners, and CA liners. Most of these techniques use nitride layers to provide tensile and compressive stresses; however, other materials can be used in other applications, e.g., HDP oxide layers.

Another method for inducing strain into the transistor utilizes a modified shallow trench isolation (STI) region. One method includes lining an STI recess with a stressor before filling the recess with a dielectric. The stressor can then impart a stress onto the adjacent semiconductor.

In the field of small, densely packed applications using small geometry CMOS transistors, however, the use of CA liners in the STI region becomes challenging because the smaller the area that can be devoted to the CA liner, the less effective the liner is at delivering a sufficient amount of channel stress.

Strain can also be induced in the channel by applying stress directly to the gate prior to the formation of the spacers. If the gate is amorphized prior to the application of the stress and annealed while under stress, a permanent stress will be memorized by the gate and the stress will be transferred to the channel.

SUMMARY OF THE INVENTION

In one embodiment of the present invention, a method of making a semiconductor device is disclosed. An electrode layer is formed over a semiconductor body. The electrode layer includes an amorphous portion. A liner, e.g., a stress-inducing liner, is deposited over the electrode layer. The electrode layer is annealed to recrystallize the amorphous portion of the electrode layer. The liner can then be removed and an electronic component (e.g., a transistor) that includes a feature (e.g., a gate) formed from the electrode layer can be formed.

The foregoing has outlined rather broadly features of the present invention. Additional features of the invention will be described hereinafter which form the subject of the claims of the invention. It should be appreciated by those skilled in the art that the conception and specific embodiment disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which:

FIG. 3 illustrates a flow diagram of one implementation of the first embodiment process;

FIG. 4 illustrates a cross-sectional view of one step of a second embodiment process; and FIG. 5 illustrates a flow diagram of one implementation of the second embodiment process.

Corresponding numerals and symbols in different figures generally refer to corresponding parts unless otherwise indicated. The figures are drawn to clearly illustrate the relevant aspects of the preferred embodiments and are not necessarily drawn to scale. To more clearly illustrate certain embodiments, a letter indicating variations of the same structure, material, or process step may follow a figure number.

DETAILED DESCRIPTION OF ILLUSTRATIVE EMBODIMENTS

The making and using of preferred embodiments are discussed in detail below. It should be appreciated, however, that the present invention provides many applicable inventive concepts that may be embodied in a wide variety of specific contexts. The specific embodiments discussed are merely illustrative of specific ways to make and use the invention, and do not limit the scope of the invention.

The invention will now be described with respect to preferred embodiments in a specific context, namely a method for improving carrier mobility in a CMOS device. Concepts of the invention can also be applied, however, to other electronic devices. As but one example, bipolar transistors (or BiCMOS) can utilize concepts of the present invention.

Figure 1:
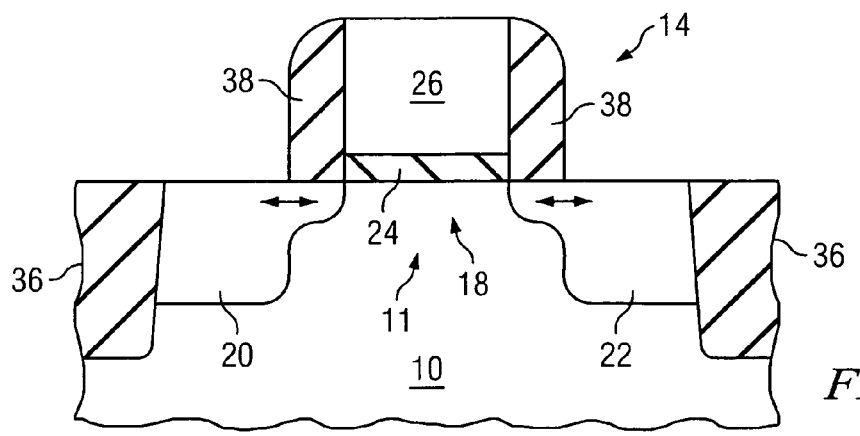
FIG. 1 illustrates a transistor device fabricated using concepts of the present invention.

An exemplary transistor device is shown in FIG. 1 and various methods for the formation of transistor devices using these concepts will then be described with respect to the cross-sectional views of FIGS. 2a-2f and FIG. 4 and the flow charts of FIGS. 3 and 5.

FIG. 1 shows an embodiment of the present invention, wherein a transistor device 14 is formed in the semiconductor body 10. In preferred embodiments, the upper surface of the channel region 18 is stressed by memorized stress within the gate electrode 26.

As will be discussed in more detail below, in preferred embodiments, an amorphized region is formed within the gate electrode layer and a stress liner is deposited over this layer. The stress liner can be formed either before or after patterning of the gate electrode 26. In the case of an n-channel transistor, a compressive stress can be generated from a tensile liner. Likewise, in the case of a p-channel transistor, a tensile stress can be generated from a compressive liner. Upon crystallization, the liner 12 distorts (e.g., compresses or stretches) the gate electrode 26 at the amorphous interface of gate electrode layer such that some lattice planes stop growing. When the gate electrode 26 is annealed and recrystallized, the liner 12 is removed, and a stress is left in the electrode 26, which in turn applies it to the active area 11. This is shown by the arrows in the FIG. 1.

The transistor 14 includes a channel region 18 disposed in the semiconductor body 10. A gate dielectric 24 overlies the channel region 18 and a gate electrode 26 overlies the gate dielectric 24. A source region 20 and a drain region 22 are disposed in the semiconductor body and spaced from each other by the channel region 18. In one example, the gate electrode 26 is stressed with a stress liner and source region 20 and drain region 22 are heavily doped regions with a lightly doped extension underlying spacers 28. For an n-channel transistor, the source/drain regions 20/22 include n+ regions, while for a p-channel transistor, the source/drain regions 20/22 include p+ regions.

In other embodiments, other semiconductor devices and elements can be fabricated using the stress transfer from the gate electrode 26, which may not actually serve as a "gate," despite the nomenclature. For example, if the doped regions 20 and 22 are formed with opposite polarities, the device 14 can be operated as a diode. In another example, the doped regions 20 and 22 can be used as contacts to one plate of a capacitor while the gate electrode 26 is used as another plate of a capacitor. This capacitor could be used, for example, as a decoupling capacitor between supply lines (e.g., $V_{DD}$ and ground) on a semiconductor chip.

FIGS. 2a-2f provides cross-sectional diagrams illustrating a first embodiment method of forming a transistor of the present invention and FIG. 3 illustrates an associated flow diagram of one implementation of the process. A second embodiment will then be described with respect to the cross-sectional view of FIG. 4 and associated flow diagram of FIG. 5. While certain details may be explained with respect to only one of the embodiments, it is understood that these details can also apply to other ones of the embodiments.

Figure 2A:
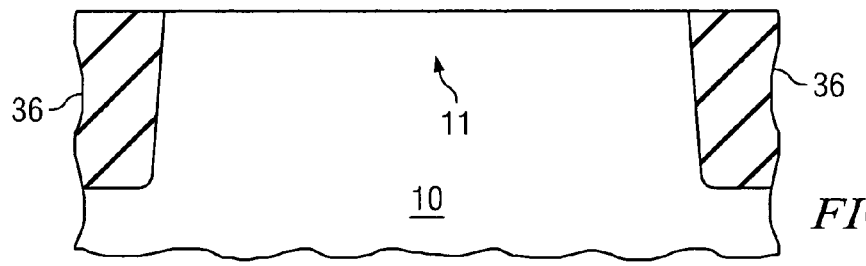
FIGS. 2a-2f illustrate cross-sectional views of a first embodiment process.

Referring first to FIG. 2a, a semiconductor body 10 is provided. In the preferred embodiment, the semiconductor body 10 is a silicon wafer. For example, the body 10 can be a bulk monocrystalline silicon substrate (or a layer grown thereon or otherwise formed therein) or a layer of a silicon-on-insulator (SOI) wafer. In other embodiments, other semiconductors such as silicon germanium, germanium, gallium arsenide or others can be used with the wafer.

In the first embodiment, isolation trenches 36 are formed in the semiconductor body 10. Isolation trenches 36 can be formed using conventional techniques. For example, a hard mask layer (not shown here), such as silicon nitride, can be formed over the semiconductor body 10 and patterned to expose the isolation areas. The exposed portions of the semiconductor body 10 can then be etched to the appropriate depth. The trenches 36 define active area 11, in which integrated circuit components can be formed.

The trenches are filled with an isolating material to form the isolation trenches 28. For example, exposed silicon surfaces can be thermally oxidized to form a thin oxide layer. The trenches can then be lined with a first material such as a nitride layer (e.g., $Si_3N_4$). The trenches can then be filled with a second material, such as an oxide. For example, a high density plasma (HDP) can be performed, with the resulting fill material being referred to as HDP oxide. In other embodiments, other trench filling processes can be used. For example, while the trench is typically lined, this step can be avoided with newer fill materials (e.g., HARP™).

Figure 2B:
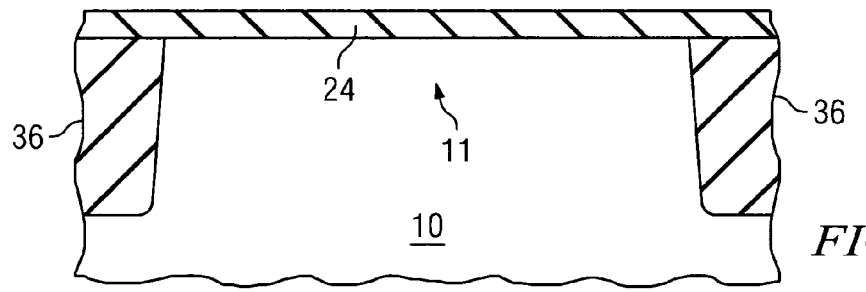

In FIG. 2b, a gate dielectric layer 24 is deposited over the semiconductor body 10. In one embodiment, the gate dielectric layer 24 comprises an oxide (e.g., $SiO_2$), a nitride (e.g., $Si_3N_4$), or a combination of oxide and nitride (e.g., SiON, or an oxide-nitride-oxide sequence). In other embodiments, a high-k dielectric material having a dielectric constant of about 5.0 or greater is used as the gate dielectric layer 24. Suitable high-k materials include $HfO_2$, $HfSiO_x$, $Al_2O_3$, $ZrO_2$, $ZrSiO_x$, $Ta_2O_5$, $La_2O_3$, nitrides thereof, $HfAlO_x$, $HfAlO_xN_{1-x-y}$, $ZrAlO_x$, $ZrAlO_xN_y$, $SiAlO_x$, $SiAlO_xN_{1-x-y}$, $HfSiAlO_x$, $HfSiAlO_xN_y$, $ZrSiAlO_x$, $ZrSiAlO_xN_y$, combinations thereof, or combinations thereof with $SiO_2$, as examples. Alternatively, the gate dielectric layer 24 can comprise other high-k insulating materials or other dielectric materials. As implied above, the gate dielectric 24 may comprise a single layer of material, or alternatively, the gate dielectric layer 24 may comprise two or more layers.

The gate dielectric layer 24 may be deposited by chemical vapor deposition (CVD), atomic layer deposition (ALD), metal organic chemical vapor deposition (MOCVD), physical vapor deposition (PVD), or jet vapor deposition (JVD), as examples. In other embodiments, the gate dielectric layer 24 may be deposited using other suitable deposition techniques. The gate dielectric layer 24 preferably comprises a thickness of about 10 Å to about 60 Å in one embodiment, although alternatively, the gate dielectric 24 may comprise other dimensions.

In the illustrated embodiment, the same dielectric layer would be used to form the gate dielectric layer 24 for both the p-channel and n-channel transistors of a CMOS device. This feature is not required, however. In alternate embodiments, the p-channel transistors and the n-channel transistors could each have different gate dielectrics.

Figure 2C:
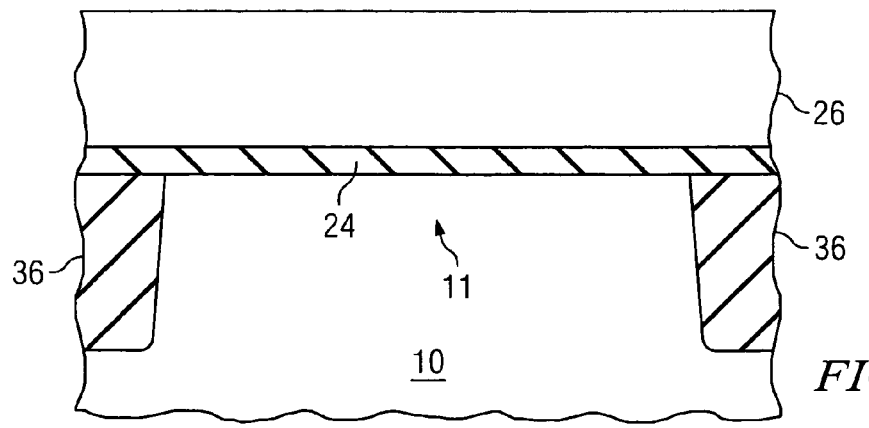

As shown in FIG. 2c, the gate electrode layer 26 is formed over the gate dielectric layer 24. The process flow described by FIG. 3 starts at this point. The gate electrode layer 26 preferably comprises a semiconductor material, such as polysilicon or amorphous silicon, although alternatively, other semiconductor materials may be used for the gate electrode layer 26. In any case, the gate electrode material should be capable of retaining and transferring stress to the channel as described herein. While the following discussion refers to polysilicon gate structures, concepts can be applied to other materials as well.

P-channel and n-channel transistors preferably include gate electrodes 26 formed from the same layers. If the gate electrodes include a semiconductor, the semiconductor can be doped differently for the p-channel transistors and the n-channel transistors. In other embodiments, different types of transistors can include gates of different materials and/or thicknesses.

Figure 2D:
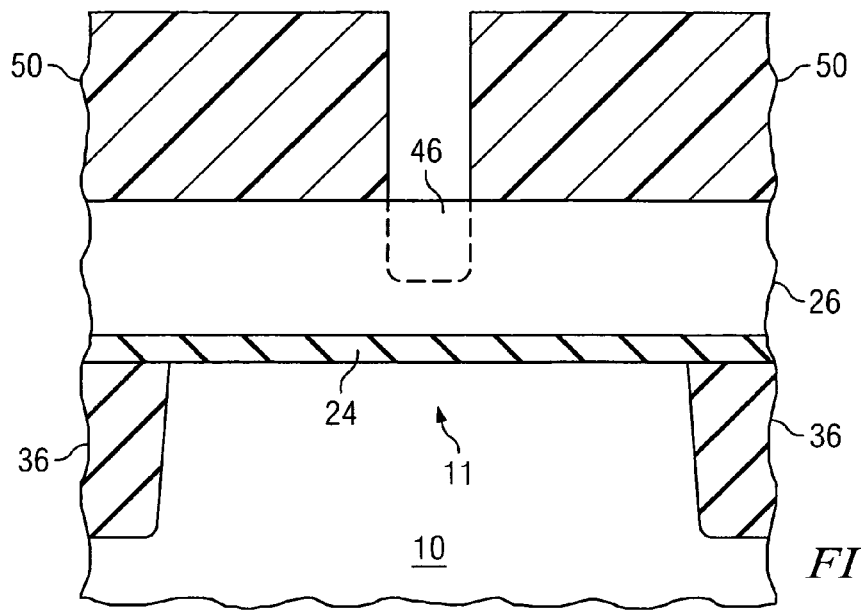

FIG. 2d illustrates the formation of a resist layer 30 over the die using a mask that defines and exposes the gate region. The resist layer 30 can be any standard positive or negative tone photoresist, as an example.

The exposed regions of gate electrode layer 26 are subjected to an ion implant. This implantation can be used to lower the resistance of the gate electrode layer 26. If the gate electrode layer is already conductive, e.g., in situ doped polysilicon or another material, this step can be omitted. In the preferred embodiment, where the gate electrode layer is a polysilicon layer, ions are implanted into the gate electrode layer 26. For example, arsenic, phosphorus and/or boron ions can be implanted with a dose of about 1e15 cm$^{-2}$ to about 5e15 cm$^{-2}$ and an implant energy between about 10 keV and about 40 keV. In other embodiments, other materials can be implanted. This ion implant will reduce the resistance of the polysilicon and form low resistivity region.

As discussed above, it is also desired to amorphize the polysilicon gate electrode layer 26. In some embodiments, the resistivity lowering implantation may be sufficient to create amorphous polysilicon. In other embodiments of the present invention, however, an additional amorphization step can be performed. For example, Ge or Xe ions can be implanted into the gate electrode layer 26. In other embodiments, other materials can be used. An advantage of using heavier ions such as Ge or Xe is that the heavier the element, the lower the variance of the lower physical boundary of amorphized region 46. Because there is less variance in the physical boundary of the amorphized region 46, it is possible to create a deeper amorphized region without risking damage to the gate dielectric layer 24. In one embodiment, Xe ions can be implanted with a dose of about 1e15 cm$^{-2}$ to about 4e15 cm$^{-2}$ and an implant energy between about 20 keV and about 30 keV.

After the appropriate implantations are performed, the resist layer 30 can be removed. In an alternate embodiment, resist layer 30 can be eliminated altogether (assuming that the n-channel gates and p-channel gates can be doped with the same conductivity dopants). In this case, the implantations steps, whether for the purpose of lowering the resistivity and/or creating the amorphous layer, can be blanket implantations. In this case, the amorphous region 46 will extend throughout an upper portion of the entire gate electrode layer 26.

In many cases, it is desirable that the gates that form part of the n-channel transistors be doped with different conductivity type dopants than the gates that form part of the p-channel transistors. In this case, the separate amorphization step, if needed, could be performed twice—once when the p-gates are exposed and once when the n-gates are exposed. Alternatively, the step may be performed once without any patterning (or with a third pattern). This alternate step could be performed before, after or between the two gate doping steps.

In some embodiments, it is desirable to stress only the n-channel or only the p-channel transistors. In these cases, the amorphization implant can be performed when the desired gates are exposed. In other words, the gates of only one conductivity type would be amorphized. This technique is convenient when stress is desired for only one of the transistor types since a gate that is not amorphous will not be likely to retain the stress of an overlying liner.

In yet another example, the gate electrode layer 26 can be deposited as amorphous silicon (or another material). In this case, additional amorphization steps would not be required. In this example, the amorphous region 46 will extend throughout the entire gate electrode layer 26. This embodiment is advantageous because the amorphous semiconductor extends all the way to the gate dielectric 24. Doping to lower the resistivity of the gate layer 26 could still be performed (either patterned or unpatterned).

Figure 2E:
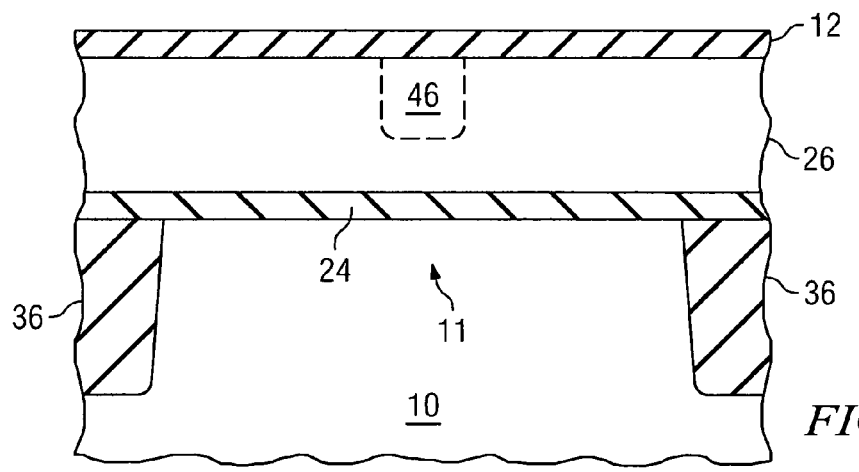

Referring now to FIG. 2e, after the resist layer 30 is removed, a liner 12 is deposited. The liner 12 is preferably a stress-inducing liner, as discussed above. For example, a nitride film (e.g., silicon nitride) is deposited in such a way as to create a stress between the liner 12 and the underlying gate electrode layer 26, including the amorphous regions 46. For a silicon nitride liner, typically the Si—N to Si—H bonding influences the stress direction—the lower the Si—H to Si—N ratio, the more tensile the stress. As is known in the art, deposition rate, pressure, UV curing, and other factors dictate this ratio.

In FIG. 2e, a single liner 12 is illustrated. A single liner can be used to create a biaxial stress, which can be applied to both the n-channel and p-channel transistors of a CMOS device. A single liner can also be used when only one of the n-channel or p-channel gates have been amorphized, since the stress liner and anneal is not likely to have a significant effect on polycrystalline silicon.

In other cases, however, it is desirable to create different types of stress in different types of transistors. For example, as discussed above, a tensile liner can create a compressive stress for an n-channel transistor while a compressive liner causes a tensile stress for a p-channel transistor. In this case, a first liner can be deposited and removed from areas where it is not needed, after which a second liner is deposited (and possibly removed from over the first liner). In this manner, different transistors will be affected by the different liners.

After the stress liner 12 is deposited, the gate electrode 26 is annealed to recrystalize any implantation damage caused by implantation and amorphization. This anneal step is preferably performed at a temperature between about 400° C. and about 1200° C., for a time between about 1 s and about 1 min. For example, a rapid thermal anneal (RTA) can be performed at a temperature of 900° C. This recrystallization preferably causes any stress in the liner 12 to be 'memorized' by the gate electrode layer 26.

Figure 2F:
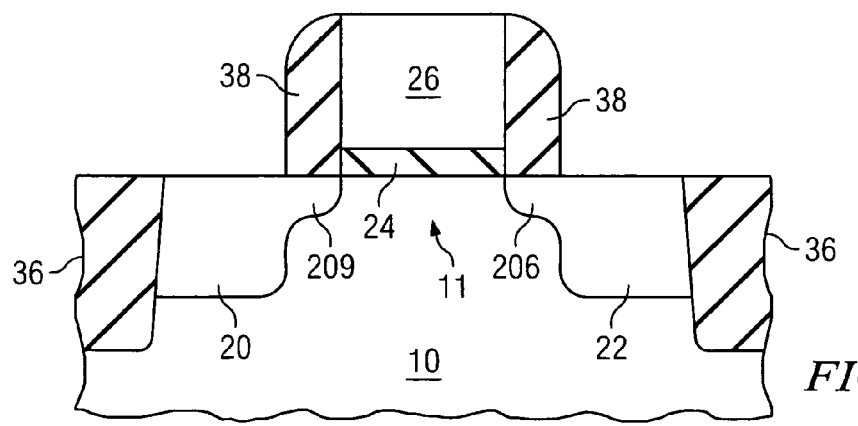

FIG. 2f illustrates the completion of the transistor device. The gate electrode layer 26 (and optionally the gate dielectric layer 24) is patterned and etched using known photolithography techniques to create the gate electrode 26 of the proper pattern. After formation of the gate electrode 26, lightly doped source/drain regions 20a and 20b can be implanted using the gate electrode 26 as a mask. Other implants (e.g., pocket implants, halo implants or double diffused regions) can also be performed as desired.

Spacers 38, which are formed from an insulating material such as an oxide and/or a nitride, can be formed on the sidewalls of the gate electrode 26. The spacers 38 are typically formed by the deposition of a conformal layer followed by an anisotropic etch. The process can be repeated for multiple layers, as desired.

The source/drain regions 20/22 can be completed with an additional ion implantation step. If a p-type transistor is to be formed, a p-type ion implant is used to form the heavily doped source 20 and drain 22. For example, boron ions can be implanted with a dose of about $1 \times 10^{15}$ cm$^{-2}$ to about $3 \times 10^{15}$ cm$^{-2}$ and an implant energy between about 1 keV and about 5 keV. In other embodiments, other materials, such as BF$_2$ can be implanted. If an n-type transistor is to be formed, an n-type ion implant is used to form the heavily doped source 20 and drain 22. In the preferred embodiment, arsenic or phosphorus ions are implanted into the source/drain regions 20/22. For example, As ions can be implanted with a dose of about $1 \times 10^{15}$ cm$^{-2}$ to about $5 \times 10^5$ cm$^{-2}$ and an implant energy between about 5 keV and about 30 keV. In other embodiments, other materials, such as P and Sb can be implanted.

While not shown, it is understood that an interlayer dielectric (ILD) layer will be formed over the device 14. Suitable ILD layers include materials such as doped glass (BPSG, PSG, BSG), organo silicate glass (OSG), fluorinated silicate glass (FSG), spun-on-glass (SOG), silicon nitride, and PE plasma enhanced tetraethyloxysilane (TEOS), as examples. Typically, gate electrode and source/drain contacts (not shown) are formed through the interlayer dielectric. Metallization layers that interconnect the various components are also included in the chip, but are not illustrated herein for the purpose of simplicity. Further, silicide regions, which are not shown, can be formed in the source 20, drain 22 and/or gate 26 to lower the resistivity of these regions.

A second embodiment will now be described with reference to the cross-sectional diagram of FIG. 4 and the flow diagram of FIG. 5. The process begins with the semiconductor body 10, a gate dielectric layer 24, and a gate electrode layer 26 as discussed above and shown in FIGS. 2a-2c. In this embodiment, the stress liner will applied after the gate electrode layer 26 is patterned and etched.

In this embodiment, it is preferred that the gate electrode layer 26 of FIG. 2c be an amorphous silicon layer. In one example, amorphous silicon can be deposited. In another example, a polycrystalline layer can be deposited and then amorphized, for example, using an implant as described above.

If desired, the conductivity doping of the n-channel and p-channel gates can be performed as described above with respect to FIG. 2d. If the layer is not previously amorphized, additional amorphization implants, e.g., Xe or Ge, can also be performed at this point.

Referring now to FIG. 4, the gate electrode layer 26 (and optionally the gate dielectric layer 24) is patterned and etched using known photolithography techniques to create the gate electrode 26 of the proper pattern. After the patterning, a stress-inducing liner 12 is deposited. As discussed above, one or more liners can be provided depending upon whether biaxial stress is desired and whether the n-channel and p-channel devices require individual stresses. In other words, each of the variations discussed above apply equally here.

In standard processing, it is common to perform a reoxidation step after the etching the polysilicon gate 26. The reoxidation step serves the purpose of improving gate oxide quality. In the preferred embodiment, however, this reoxidation step is not performed because it is desirable that the gate layer not be recrystallized before the stress liner 12 is applied.

After the stress liner 12 is deposited, the gate electrode 26 is annealed to recrystallize any implantation damage done to the gate material caused by implanting and amorphizing. Once again, this anneal step will cause the stress of the liner to be induced in and 'memorized' by the gate electrode 26. The liner 12 can then be removed. The standard reoxidation step described above can then be performed and processing can continue as described above with respect to FIG. 2f.

As discussed above, in some embodiments the active areas of both n-channel and p-channel transistors will experience the same type of stress. This may be desirable, e.g., in the case where a biaxial stress is useful, or at least tolerable in other cases. In other examples, any stress from one of the transistor types (e.g., n-type or p-type) can be relieved before forming that type of transistor.

For example, if a tensile liner is deposited, the performance of the n-channel transistors will be enhanced. The compressive stress (i.e., the stress in the semiconductor created by the tensile liner) is not desired for the p-channel transistors and can be relieved (e.g., compensated for), for example, by utilizing embedded silicon germanium in the p-channel active region. Here, the silicon is etched and filled up with epitaxial SiGe in the source/drain regions only. Such a standard approach would remove much of the tensile strained Si and over compensate for the tensile strain in the channel. Alternatively, the stress can be relieved when the insulating material is deposited for the STI 36. For example, HDP shallow trench isolation can be used to relieve stress for the p-channel transistors because the compressive stress from the STI can compensate for the tensile strain from the stressed layer.

If a compressive liner is deposited, the performance of the p-channel transistors will be enhanced. The tensile stress is not desired for the n-channel transistors and can be relieved or compensated for. For example, embedded silicon carbon (SiC) can be utilized or an STI filled using HARP™ (high aspect ratio process), which is available from Applied Materials.

In other embodiments, the stress does not need to be compensated. For example, a biaxial strain is desirable for both n-channel and p-channel transistors. A biaxially stressed layer will experience stress in a direction parallel to current flow and also in a direction perpendicular to current flow. In order to maintain biaxial stress, it is preferred that the active areas be substantially square, i.e., have edges that are no more than 50% different in length (i.e., $\frac{2}{3} \leq d_2/d_1 \leq \frac{3}{2}$). In this case, it may be desirable to make wide transistors and include an additional STI so that a single wide transistor can be implemented as multiple narrower transistors in parallel.

Embodiments of the present invention can be utilized in conjunction with other stress-inducing techniques. Co-pending U.S. patent application Ser. No. 11/521,809, which is filed concurrently herewith and is incorporated herein by reference, provides another example of using stress memory techniques that can be combined with embodiments described herein. In this co-pending application, a stress memory transfer region extends throughout the source and drain regions.

Yet another example of a stress inducing technique is taught in co-pending U.S. patent application Ser. No. 11/354,616, which was filed on Feb. 16, 2006 and is incorporated herein by reference. In this application, stress is induced in active areas prior to the formation of the gate electrodes. Once again, the process taught in this co-pending application can be utilized with the techniques taught herein. In fact, any of the techniques from these applications can be combined as desired.

Embodiments of the present invention can be utilized in conjunction with other stress-inducing techniques. For example, it is known to form a contact etch stop layer (CESL) or CA liner as a stress-inducing layer. Any stress induced by this layer can be additive to the stress already discussed above. As one example, co-pending U.S. patent application Ser. No. 11/521,804, which is incorporated herein by reference, teaches an example of a stress-inducing layer. The techniques for forming this layer that are taught in that application can be applied here.

It will also be readily understood by those skilled in the art that materials and methods may be varied while remaining within the scope of the present invention. It is also appreciated that the present invention provides many applicable inventive concepts other than the specific contexts used to illustrate preferred embodiments. Accordingly, the appended claims are intended to include within their scope such processes, machines, manufacture, compositions of matter, means, methods, or steps.

What is claimed is:

1. A method of making a semiconductor device, the method comprising:
providing a semiconductor body, the semiconductor body comprising an active area separated by isolation regions;
forming an electrode layer over the semiconductor body, the electrode layer including an amorphous portion and a crystalline portion, the amorphous portion being disposed over a first portion of the active area, the crystalline portion being disposed over a second portion and a third portion of the active area, wherein the first portion is disposed between the second and the third portions;
depositing a liner over the electrode layer;
annealing the electrode layer to recrystallize the amorphous portion of the electrode layer;
removing the liner; and
forming an electronic component that includes a feature formed from the electrode layer.

2. The method of claim 1, wherein forming an electrode layer comprises depositing an amorphous semiconductor layer.

3. The method of claim 1, wherein forming an electrode layer comprises depositing a polycrystalline semiconductor layer and performing an amorphizing implant to form the amorphous portion.

4. The method of claim 3, wherein forming an electrode layer further comprises performing a masking step after depositing the polycrystalline semiconductor layer but before performing the amorphizing implant.

5. The method of claim 1, further comprising patterning and etching the electrode layer to form a gate of a transistor device, wherein the liner is deposited before the patterning and etching of the electrode layer.

6. The method of claim 1, further comprising patterning and etching the electrode layer to form a gate of a transistor device, wherein the liner is deposited after the patterning and etching of the electrode layer.

7. The method of claim 1, wherein depositing a liner comprises depositing a stress-inducing liner.

8. The method of claim 7, wherein depositing a liner comprises depositing a tensile liner and wherein forming an electronic component comprises forming an n-channel transistor.

9. The method of claim 7, wherein depositing a liner comprises depositing a compressive liner and wherein forming an electronic component comprises forming a p-channel transistor.

10. A method of making a semiconductor device, the method comprising:
providing a semiconductor body having an active area separated by isolation regions;
forming a gate dielectric layer over the semiconductor body;
forming a gate electrode layer comprising polysilicon over the gate dielectric layer;
performing an amorphizing implant to create an amorphous portion of the gate electrode layer, the amorphous portion being disposed over a first region of the active area, wherein portions of the gate electrode layer disposed over a second region and a third region of the active area are crystalline after the amorphizing implant, and wherein the first region is disposed between the second and the third region;
depositing a liner over the gate electrode layer;
annealing the gate electrode layer to recrystallize the amorphous portion;
removing the liner; and
patterning and etching the gate electrode layer to form a gate electrode.

11. The method of claim 10, further comprising:
prior to performing the amorphizing implant, forming a masking layer over the semiconductor body; and
exposing a portion of the gate electrode layer through an opening in the masking layer, wherein the amorphizing implant is performed through the opening.

12. The method of claim 11, wherein a conductivity-increasing implant is performed through the opening in the masking layer.

13. The method of claim 12, wherein the conductivity-increasing implant comprises the amorphizing implant.

14. The method of claim 10, wherein depositing the liner comprises depositing a stress inducing liner.

15. The method of claim 10, wherein the annealing comprises a rapid thermal anneal at a temperature of between 400° C. and 1200° C.

16. The method of claim 10, wherein performing an amorphizing implant comprises implanting Xe or Ge.

17. The method of claim 1, further comprising:
forming a gate dielectric layer over the semiconductor body and disposed under the electrode layer;
patterning and etching the electrode layer to form a gate electrode, the gate electrode being formed at least partially of the recrystallized amorphous portion;
wherein forming the electronic component comprises forming a transistor that includes the gate electrode.

18. The method of claim 17, wherein forming a gate electrode layer comprises depositing a polycrystalline semiconductor layer and performing an amorphizing implant to create an amorphous semiconductor.

19. The method of claim 17, wherein depositing a liner comprises depositing a stress-inducing liner.

20. The method of claim 19, wherein depositing a liner comprises depositing a tensile liner and wherein forming a transistor comprises forming an n-channel transistor.

21. The method of claim 19, wherein depositing a liner comprises depositing a compressive liner and wherein forming a transistor comprises forming a p-channel transistor.

22. The method of claim 17, further comprising performing a reoxidation step after removing the liner.

23. The method of claim 17, wherein annealing comprises a rapid thermal anneal at a temperature of between 400° C. and 1200 C.

* * * * *